(12) United States Patent
Willard

(10) Patent No.: US 10,058,005 B1
(45) Date of Patent: Aug. 21, 2018

(54) COMPUTER HARDWARE UNIT WITH COLLAPSIBLE MOUNTING BRACKETS

(71) Applicant: VCE IP Holding Company LLC, Richardson, TX (US)

(72) Inventor: Gary Willard, Raleigh, NC (US)

(73) Assignee: VCE IP Holding Company LLC, Richardson, TX (US)

( * ) Notice: Subject to any disclaimer, the term of this patent is extended or adjusted under 35 U.S.C. 154(b) by 0 days.

(21) Appl. No.: 15/349,567

(22) Filed: Nov. 11, 2016

(51) Int. Cl.
*H05K 7/14* (2006.01)
*G06F 1/18* (2006.01)

(52) U.S. Cl.
CPC .......... *H05K 7/1489* (2013.01); *G06F 1/181* (2013.01); *H05K 7/1492* (2013.01)

(58) Field of Classification Search
CPC ..... H05K 7/1489; H05K 7/1492; G06F 1/181
USPC ........................................................ 361/727
See application file for complete search history.

(56) References Cited

U.S. PATENT DOCUMENTS

| | | | | |
|---|---|---|---|---|
| 8,605,444 B2* | 12/2013 | Liang | ................... | H05K 7/1491 312/223.2 |
| 2005/0284033 A1* | 12/2005 | Chen | .................... | H05K 7/1489 52/64 |
| 2008/0135705 A1* | 6/2008 | Chuang | ................ | H05K 7/1489 248/243 |
| 2013/0188309 A1* | 7/2013 | Ross | ................... | H05K 7/20727 361/679.48 |
| 2014/0021154 A1* | 1/2014 | Chen | .................... | H05K 7/1489 211/86.01 |

* cited by examiner

*Primary Examiner* — Nidhi Thaker
(74) *Attorney, Agent, or Firm* — Womble Bond Dickinson (US) LLP

(57) ABSTRACT

A computer hardware unit, a data center cabinet having the same, and a method of removing the computer hardware unit from the data center cabinet. The computer hardware unit has a housing for placement within a slot of the data center cabinet. At least one of a compute component, a network component and a memory component is provided within the housing. At least one mounting bracket is attached to the housing and to secure the housing to the cabinet. The at least one mounting bracket has a first leg attached to the housing and a second leg for attachment to the cabinet. The at least one mounting bracket is collapsible to change an internal angle between the first leg and the second leg.

18 Claims, 4 Drawing Sheets

COMPUTER HARDWARE UNIT WITH COLLAPSIBLE MOUNTING BRACKETS

FIELD OF THE DISCLOSURE

The present disclosure relates to computer hardware units, such as servers, switches and memory units, traditionally stored in data center cabinets.

BACKGROUND

Expanding demand for data processing of information within present corporate or enterprise environments requires an increase in processing cores, Central Processing Units (CPUs), memory, and storage. Data center cabinets are now widely used to organize and store enterprise computer hardware in a modular form. The modularity of these systems enables rapid expansion with increasing demand for capability. The modularity of these systems is also touted for their ability to be maintained, repaired and reconfigured relatively quickly.

Often, power outlet units are mounted to data center cabinets, such as on the rear side of a cabinet. The power outlet units provide a connection between a power source and the enterprise computer hardware units. By attaching the power outlet units on the data center cabinets, cable and wire management can be improved. The presence of a power outlet unit, however, may impede the installation or removal of enterprise computer hardware units secured within the cabinets by traditional means. Typically, adding or removing a module from the data center cabinet has required removing at least one power outlet unit. Therefore, further improvements to data center cabinets and their computer hardware units are desired.

SUMMARY

Embodiments of the present disclosure include computer hardware units configured to be more easily installed to and removed from data center cabinets. Computer hardware units of this type may include a housing configured for use in a data center cabinet and at least one of a compute component, a network component and a memory component provided within the housing. At least one mounting bracket is attached to the housing and configured for securing the housing to the cabinet. The at least one mounting bracket comprises a first leg attached to the housing and a second leg for attachment to the cabinet. The at least one mounting bracket further comprises a hinge between the first leg and the second leg to allow the at least one mounting bracket to fold during at least one of installation and removal of the housing from the cabinet.

Other embodiments of the present disclosure include a data center cabinet with a computer hardware unit configured to be easily installed into and removed from the cabinet. Data center cabinets of this type may include a plurality of slots and a computer hardware unit installed within one of the plurality of slots. The computer hardware unit includes at least one mounting bracket having a first leg and a second leg substantially perpendicular to the first leg. The at least one mounting bracket further comprises a hinge between the first leg and the second leg to allow the mounting bracket to fold during at least one of installation and removal of the housing from the cabinet.

Yet other embodiments of the present disclosure include a computer hardware unit having a housing for placement within a slot of the data center cabinet. At least one of a compute component, a network component and a memory component is provided within the housing. At least one mounting bracket is attached to the housing and to secure the housing to the cabinet. The at least one mounting bracket has a first leg attached to the housing and a second leg for attachment to the cabinet. The at least one mounting bracket is collapsible to change an internal angle between the first leg and the second leg.

The present disclosure also includes a method of removing a hardware unit from a data center cabinet having at least one power outlet unit. The hardware unit comprising a mounting bracket initially fastened to the cabinet. The method comprises unfastening the mounting bracket from the cabinet and collapsing a first leg of the mounting bracket relative to a second leg of the mounting bracket to decrease a width of the hardware unit. The method further includes sliding the hardware unit relative to the slot to remove the hardware unit from the data center cabinet.

It will be appreciated that the above summary is provided merely for purposes of summarizing some example embodiments so as to provide a basic understanding of some aspects of the disclosure. As such, it will be appreciated that the above described example embodiments are merely examples of some embodiments and should not be construed to narrow the scope or spirit of the disclosure in any way. It will be appreciated that the scope of the disclosure encompasses many potential embodiments, some of which will be further described below, in addition to those here summarized. Further, other aspects and advantages of embodiments disclosed herein will become apparent from the following detailed description taken in conjunction with the accompanying drawings which illustrate, by way of example, the principles of the described embodiments.

BRIEF DESCRIPTION OF THE DRAWINGS

Having thus described the disclosure in general terms, reference will now be made to the accompanying drawings, which are not necessarily drawn to scale.

Figure 1:
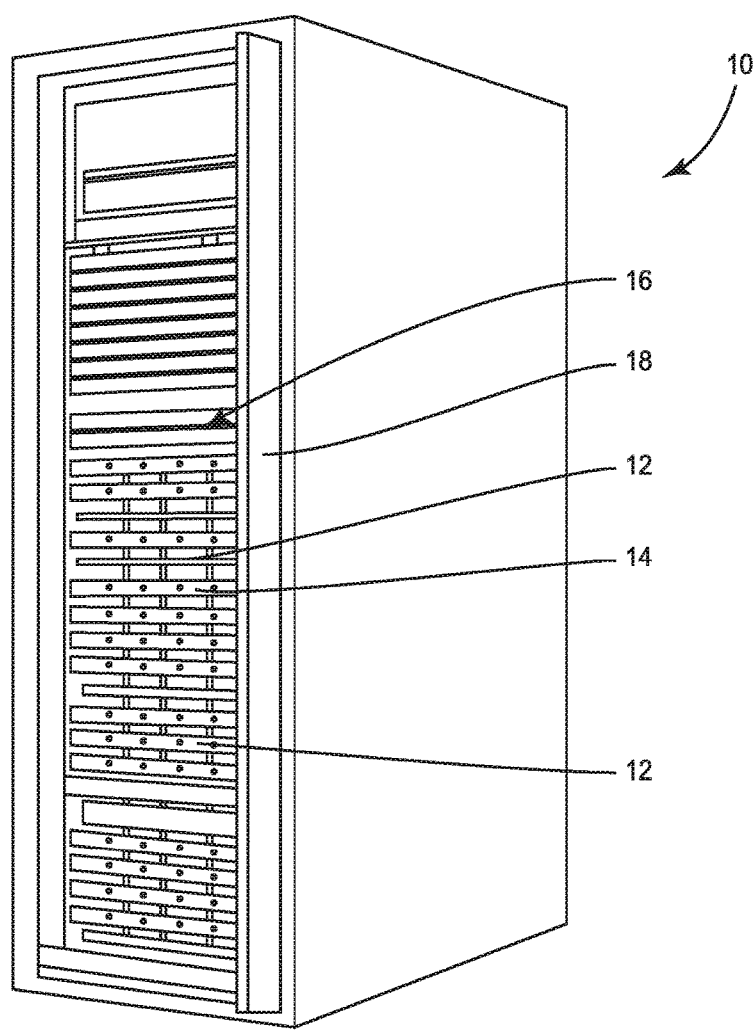

FIG. 1 is a representative data center cabinet.

Figure 2:
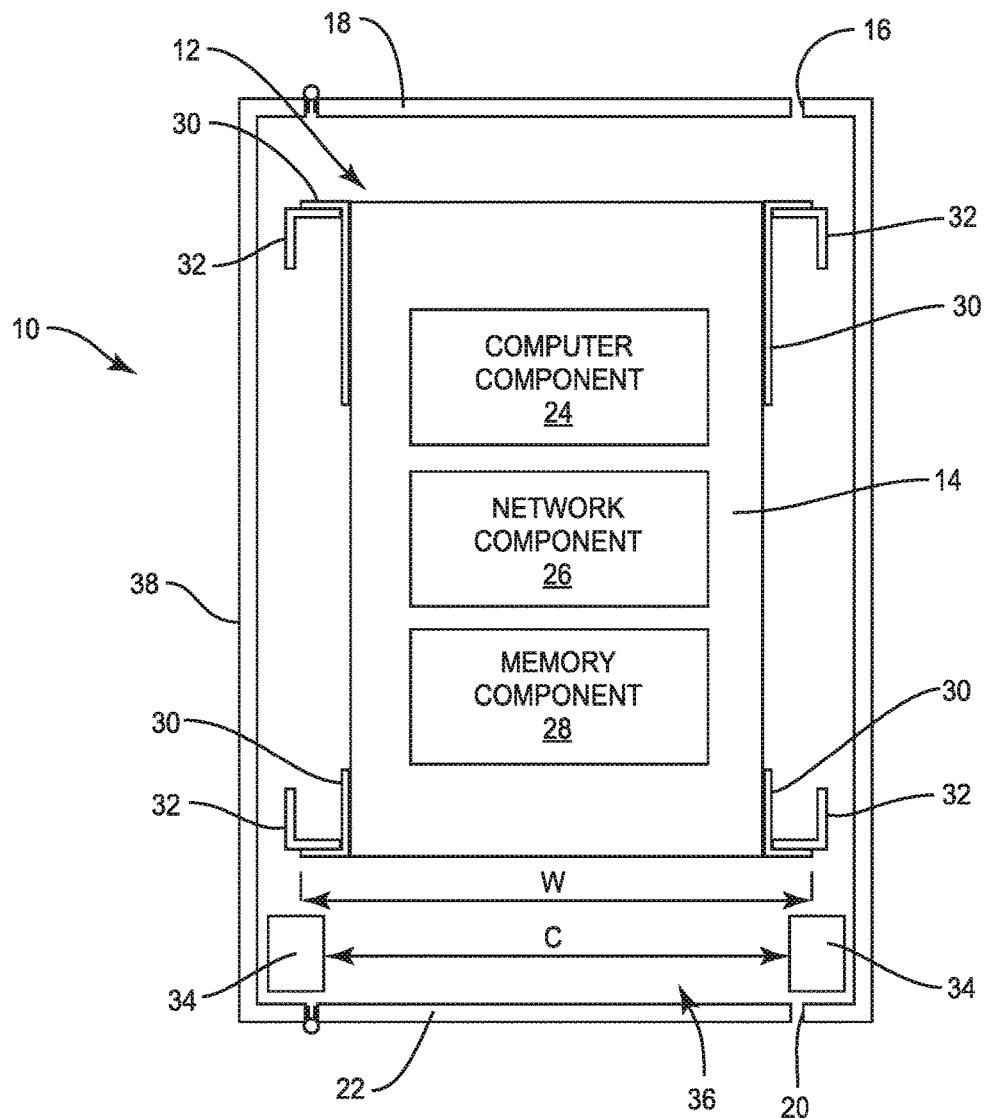

FIG. 2 is a schematic of a conventional method of mounting a computer housing within a data center cabinet.

Figure 3:
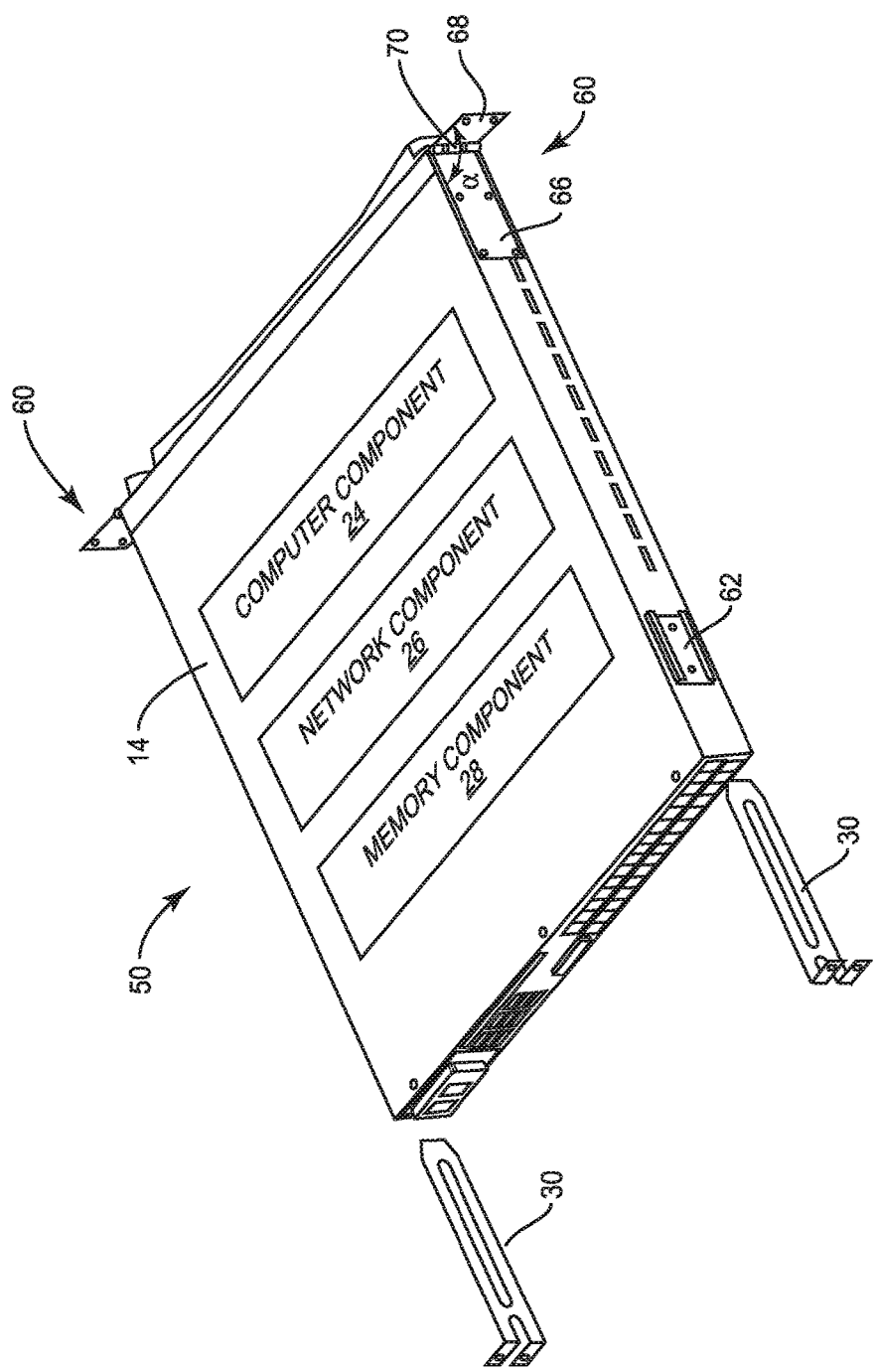

FIG. 3 shows a computer hardware unit according to an embodiment of the present disclosure.

Figure 4:
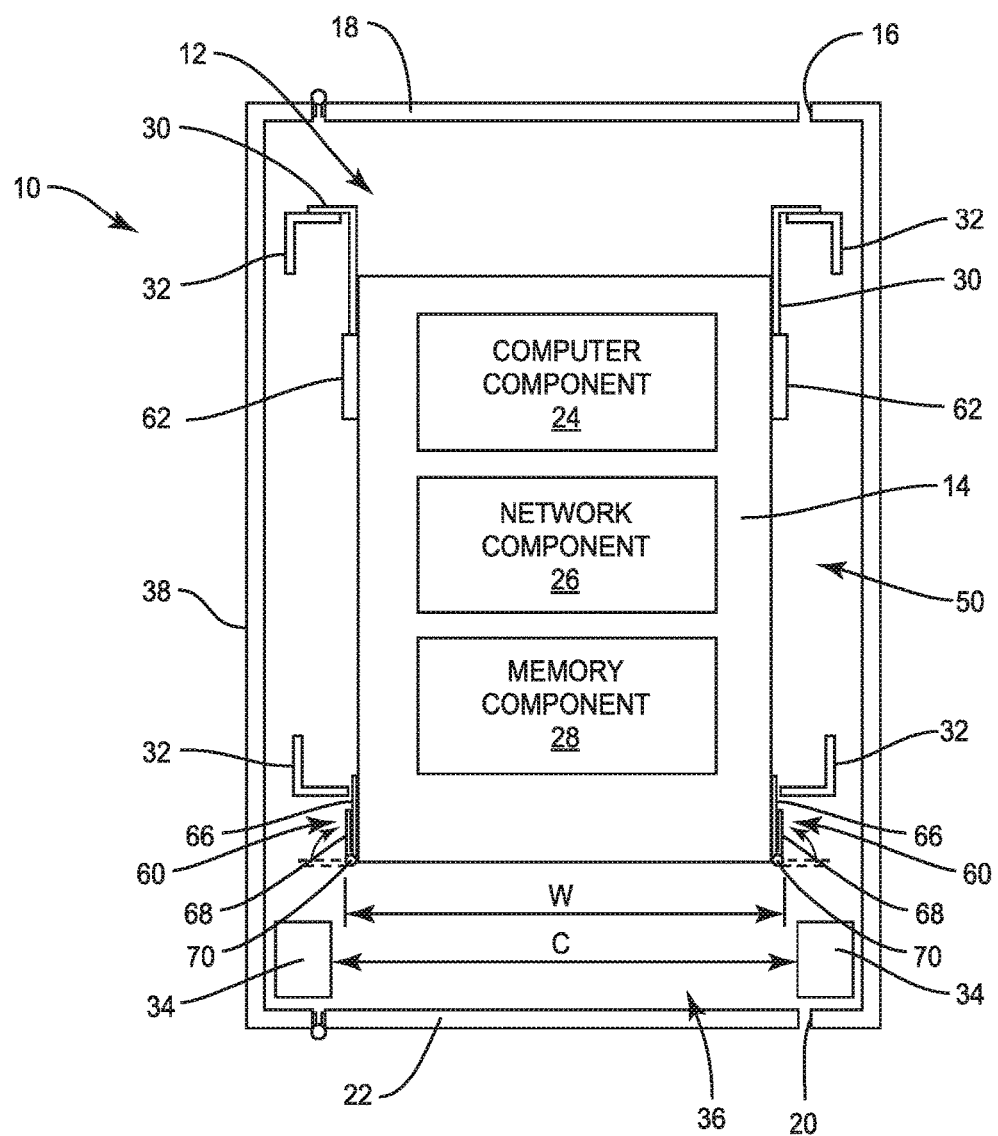

FIG. 4 schematically shows the computer hardware unit of FIG. 3 installed in a data center cabinet.

DETAILED DESCRIPTION

Although the present invention has and will be described in connection with one embodiment, the invention is not intended to be limited to the specific forms set forth herein. On the contrary, it is intended to cover such alternatives, modifications, and equivalents as can be reasonably included within the scope of the invention as defined by the appended claims.

In the following detailed description, numerous specific details such as specific method orders, structures, elements, and connections may be set forth. It is to be understood however that these and other specific details need not be utilized to practice embodiments of the present invention. In other circumstances, well-known structures, elements, or connections have been omitted, or have not been described in particular detail in order to avoid unnecessarily obscuring this description.

References within the specification to "one embodiment" or "an embodiment" are intended to indicate that a particular feature, structure, or characteristic described in connection with the embodiment is included in at least one embodiment of the present invention. The appearance of the phrase "in one embodiment" in various places within the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not other embodiments.

FIG. 1 shows a data center cabinet 10, sometimes referred to as a rack, with a plurality of slots 12 for holding a plurality of housings 14, each containing at least one of a compute component, a network component and a memory component. Data center cabinets 10 often include a front access opening 16, traditionally provided with a front door 18. Data center cabinets 10 often also include a rear access opening 20 (FIG. 2), which may include a rear door 22.

Moving to FIG. 2, a housing 14 is shown with a compute component 24, a network component 26 and a memory component 28. A set of four permanent L-shaped brackets 30 are used to affix the housing 14 to four corner rails 32 within the cabinet 10. Traditionally, one or more power outlet units 34 are installed adjacent to the rear access opening 20 of the cabinet 10. With the permanent L-shaped brackets 30 in place, the width W between the ends of the permanent L-shaped brackets is greater than the clearance C of the gap 36 between the pair of power outlet units 34, preventing extraction of the housing 14 from the cabinet 10 without removing at least one of the power outlet units 34 or removing at least one of the permanent L-shaped brackets 30 from the housing 14. In order to remove a permanent L-shaped bracket 30 from the housing 14 would require access to a lateral side of the housing. Such access is typically unavailable within data center cabinets 10 due to the presence of side walls 38 of the cabinet.

Turning to FIG. 3, a computer hardware unit 50 according an embodiment of the present disclosure is shown. The computer hardware unit 50 also includes a housing 14 having at least one of a compute component 24, a network component 26 and a memory component 28 provided inside. The compute component 24 may include, but is not limited to one or more servers (e.g., blade servers, rack servers, and/or other servers), one or more fabric extenders, one or more fabric interconnects, a chassis, and/or other compute layer components that may be implemented on a converged infrastructure to provide computing and processing resources. The network component 26 may include, but is not limited to, one or more switches or other components that provide switching and routing functions.

The memory component 28, if present, may include, but is not limited to read only memory (ROM), random access memory (RAM), and/or the like. The memory component 28 may be mass storage with one or more memory and/or other storage devices, which may include fixed (e.g., a fixed hard disc drive, storage array, fixed flash memory device, and/or the like) and/or removable memory devices (e.g., a removable flash memory device, an optical disc drive, and/or other removable memory device). The memory component 28 may provide a persistent data storage device. In some example embodiments, the memory component 28 may be configured to provide a backup storage. In some embodiments, the memory component 28 may provide a non-transitory computer-readable storage medium that may store computer program instructions that may be executed by the compute component 24. In this regard, the memory component 28 may be configured to store information, data, applications, instructions and/or the like for enabling the compute component 24 to carry out various functions in accordance with one or more example embodiments.

The computer hardware unit 50 also includes at least one collapsible mounting bracket 60 attached to the housing 14 for securing the housing to the rails 32 of the data center cabinet 10. In the illustrated embodiment, the computer hardware unit 50 includes two collapsible mounting brackets 60, one on each opposite side of the housing 14, and both provided adjacent to the rear of the housing 14.

Two permanent, i.e. fixed shape, L-shaped brackets 30 are also used in the embodiment of FIG. 3. The permanent L-shaped brackets 30 attach to the housing 14 adjacent to the front of the housing and are used to attach the computer hardware unit 50 to the rails 32 near the front access opening 16 of the data center cabinet 10. The permanent L-shaped brackets 30 may be attached to the housing 14 with respective slide tracks 62, which allow the housing 14 to slide relative to the front permanent L-shaped brackets 30.

The collapsible mounting bracket 60 is configured to change its shape or configuration. Particularly, the collapsible mounting bracket 60 facilitates the ability to adjust the width W of at least a portion of the computer hardware unit 50. The illustrated example of the collapsible mounting bracket 60 includes a first leg 66 attached to the housing 14 and a second leg 68 for attachment to the cabinet 10, such as attachment to one of the rails 32. The first leg 66 is shown as longer than the second leg 68. In other embodiments, the second leg 68 may be as long or longer than the first leg 66. In one embodiment, a hinge 70 is provided between the first leg 66 and the second leg 68. As used herein, the term "hinge" is used to include the articulable joint between the first leg 66 and the second leg 68. The legs 66, 68 may generally be considered as the leaves of the hinge 70. The hinge 70 allows the collapsible mounting bracket 60 to fold. In one embodiment, the hinge 70 includes a pivot pin. In other embodiments, the hinge 70 is a living hinge integrated as one unitary piece between the first leg 66 and the second leg 68. In the unfolded or mounting position shown in FIG. 3, the first leg 66 is substantially perpendicular to the second leg 68 to form an L-shape. In the folded position, also referenced as the installation or removal position, the first leg 66 may be substantially parallel with and overlay the second leg 68 as the legs fold toward one another. In other words, the first leg 66 may fold to be closed next to the second leg 68. In one example, the collapsible mounting bracket 60 may be a ninety degree stop hinge, i.e. the maximum internal angle alpha between the first leg 66 and the second leg 68 is ninety degrees. In other embodiments, the first leg 66 and the second leg 68 may be able to obtain an installation or removal position where the first leg 66 is substantially coplanar or collinear with the second leg 68.

The illustrated collapsible mounting bracket 60 pivots with the use of a hinge 70 to obtain a folded position. The present disclosure is not necessarily limited to hinged mounting brackets. The collapsible mounting bracket 60 may formed from a resilient material that has an initial L-shape and is capable of changing shape to modify the width W of a portion of the computer hardware unit 50. For example, the collapsible mounting bracket 60 may be a resilient rubber material. Alternatively, the collapsible mounting bracket 60 could be made from a shape memory alloy, such as NiTiNOL.

Turning to FIG. 4, a method of removing the computer hardware unit 50 from a slot 12 is schematically illustrated. A similar method of installation will be understood by one of ordinary skill in the art by generally revising the removal steps. A process for removing the computer hardware unit 50 includes unfastening each of the collapsible mounting brackets 60 from the cabinet 10. For example, fasteners, such as screws, may be used to secure the second leg 68 of the collapsible mounting bracket 60 to a respective rail 32. Therefore unfastening the collapsible mounting bracket 60 from the cabinet 10 may be include removing screws from the second leg 68.

The computer hardware unit 50 may then be capable of sliding toward the rear access opening 20 due to the sliding connection between the slide tracks 62 and the permanent L-shaped brackets 30 at the front of the computer hardware unit 50. The process of removal may continue by collapsing the second leg 68 relative to the first leg 66 to decrease the width W of the computer hardware unit 50. In the illustrated example, the second leg 68 is folded toward the first leg 66 so that the first leg overlays the second leg. Folding of the second leg 68 toward the first leg 66 may be performed by a technician. Alternatively, the power outlet unit 34 may come into contact with the second leg 68 as the housing 14 is pulled toward the rear access opening 20. The contract with the power outlet unit 34 would cause collapse of the second leg 68 toward the first leg 66. With each of the collapsible mounting brackets folded, the width W is less than the clearance C of the gap 36, and the housing 14 may be slid out from the slot 12 by passing between the pair of power outlet units 34. Therefore, by providing at least one, and preferably a pair of collapsible mounting brackets as part of the computer hardware unit 50, the computer hardware unit 50 may be removed from the cabinet 10 without removing the collapsible mounting brackets 60 from the housing 14 and without removing the power outlet units 34 from the cabinet 10.

The embodiment of FIG. 4 suggests the removal of the computer hardware unit 50 through the rear access opening 20 of the cabinet 10. In other situations, such as where wire and cabling impact sliding, the computer hardware unit 50 may be preferably removed through the front access opening 16 of the cabinet 10. After unfastening the collapsible mounting brackets 60 from the rear rails 32, the housing 14 may be slide toward the rear access opening 20 enough so that the second leg 68 of the collapsible mounting bracket 60 has sufficient room to fold toward the first leg 66. Then, the housing may be slide toward and through the front access opening 16 if the width W is less than the distance between the rails 32.

An alternative process for removing the computer hardware unit 50 through the front access opening 16 would include collapsing the collapsible mounting bracket 60 by folding the second leg 68 away from the first leg 66, increasing the internal angle therebetween. By rotating the second leg 68 away from the first leg 66 until the legs are substantially co-planar, the width W can potentially be even further reduced and all the computer hardware unit to be slide out of the cabinet 10 through the front access opening 16 by passing between the pair of front rails 32.

Many modifications of the embodiments set forth herein will come to mind to one skilled in the art to which these disclosed embodiments pertain having the benefit of the teachings presented in the foregoing descriptions and the associated drawings. Therefore, it is to be understood that embodiments of the invention are not to be limited to the specific embodiments disclosed and that modifications and other embodiments are intended to be included within the scope of the invention. Moreover, although the foregoing descriptions and the associated drawings describe example embodiments in the context of certain example combinations of elements and/or functions, it should be appreciated that different combinations of elements and/or functions may be provided by alternative embodiments without departing from the scope of the disclosure. In this regard, for example, different combinations of elements and/or functions than those explicitly described above are also contemplated within the scope of the disclosure. Although specific terms are employed herein, they are used in a generic and descriptive sense only and not for purposes of limitation.

It should be understood that although the terms first, second, etc. may be used herein to describe various steps or calculations, these steps or calculations should not be limited by these terms. These terms are only used to distinguish one operation or calculation from another. For example, a first calculation may be termed a second calculation, and, similarly, a second step may be termed a first step, without departing from the scope of this disclosure. As used herein, the term "and/or" and the "/" symbol includes any and all combinations of one or more of the associated listed items.

As used herein, the singular forms "a," "an," and "the" are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof. Therefore, the terminology used herein is for the purpose of describing particular embodiments only and is not intended to be limiting.

The invention claimed is:

1. A computer hardware unit, comprising: a housing configured for use in a data center cabinet including a first pair of corner rails and a second pair of corner rails, the first pair of corner rails having a pair of L-shaped brackets secured thereto; at least one of a compute component, a network component and a memory component provided within the housing; a pair of slide tracks mounted on opposite sides of the housing that allow the housing to slide relative to the pair of L-shaped brackets secured to the first pair of corner rails of the cabinet, L-shaped brackets of slide tracks of the pair of slide tracks; and a pair of mounting brackets separate and distinct from the pair of slide tracks, mounted on the opposite sides of the housing and configured for securing the housing to the second pair of corner rails of the cabinet, wherein a mounting bracket of the pair of mounting brackets comprises a first leg attached to the housing and a second leg for attachment to a corner rail of the second pair of corner rails of the cabinet, wherein the mounting bracket further comprises a hinge between the first leg and the second leg to avow the mounting bracket to fold during at least one of installation and removal of the housing from the cabinet.

2. The computer hardware unit of claim 1, wherein the first leg of the mounting bracket is longer than the second leg.

3. The computer hardware unit of claim 1, wherein the mounting bracket is a 90 degree stop hinge wherein in a mounting position the first leg is perpendicular to the second leg and in an installation position, the first leg overlays the second leg.

4. A data center cabinet, comprising:
a plurality of slots;
a computer hardware unit according to claim 1 installed within one of the plurality of slots.

5. The data center cabinet of claim 4, further comprising at least one power outlet unit secured to the cabinet adjacent to the computer hardware unit,
wherein the at least one power outlet unit impedes removal of the computer hardware unit from the slot when the first leg is substantially perpendicular to the second leg, and
wherein the computer hardware unit is removable from the cabinet past the at least one power outlet unit when the first leg is folded substantially parallel with the second leg of the at least one mounting bracket.

6. The data center cabinet of claim 4, wherein the mounting bracket is a 90 degree stop hinge wherein in an installation position, the first leg overlays the second leg.

7. A method of removing a hardware unit from a slot of a data center cabinet, the method comprising: accessing the hardware unit in the data center cabinet including a first pair of corner rails and a second pair of corner rails; the first pair of corner rails having a pair of L-shaped brackets secured thereto, the hardware unit comprising: a housing within which at least one of a compute component, a network component and a memory component is provided; a pair of slide tracks mounted on opposite sides of the housing that avow the housing to slide relative to the pair of L-shaped brackets secured to the first pair of corner rails of the cabinet, L-shaped brackets of the pair of L-shaped brackets being configured to slide within respective slide tracks of the pair of slide tracks; and a pair of mounting brackets separate and distinct from the pair of slide tracks, mounted on the opposite sides of the housing and fastened to the second pair of corner rails of the cabinet, wherein a mounting bracket of the pair of mounting brackets comprises a first leg attached to the housing and a second leg fastened to a corner rail of the second pair of corner rails of the cabinet; unfastening the pair of mounting brackets from the second pair of corner rails of the cabinet, including unfastening the second leg of the mounting bracket from the corner rail of the second pair of corner rails of the cabinet; collapsing the second leg of the mounting bracket relative to the first leg of the mounting bracket to decrease a width of the hardware unit; and sliding the hardware unit relative to the slot.

8. The method of claim 7, where the data center cabinet includes at least one power outlet unit, and sliding the hardware unit comprises sliding the hardware unit past the at least one power outlet unit to be removed from the cabinet.

9. The method of claim 7, wherein the hardware unit is removed from the cabinet without removing the power outlet unit from the cabinet.

10. The method of claim 7, wherein the hardware unit is removed from the cabinet without removing the mounting bracket from the hardware unit.

11. The method of claim 7, wherein collapsing comprises folding with use of a hinge.

12. The method of claim 11, wherein folding comprises pivoting the first leg toward the second leg so that the first leg overlays the second leg.

13. The method of claim 11, wherein folding comprises pivoting the first leg away from the second leg so that the first leg is substantially co-planar with the second leg.

14. A computer hardware unit, comprising: a housing configured for use in a data center cabinet including a first pair of corner rails and a second pair of corner rails, the first pair of corner rails having a pair of L-shaped brackets secured thereto; at least one of a compute component, a network component and a memory component provided within the housing; a pair of slide tracks mounted on opposite sides of the housing that allow the housing to slide relative to the pair of L-shaped brackets secured to the first pair of corner rails of the cabinet, L-shaped brackets of the pair of L-shaped brackets being configured to slide within respective slide tracks of the air of slide tracks; and a pair of mounting brackets separate and distinct from the pair of slide tracks, mounted on the opposite sides of the housing and configured for securing the housing to the second pair of corner rails of the cabinet, wherein a mounting bracket of the pair of mounting brackets comprises a first leg attached to the housing and a second leg for attachment to a corner rail of the second pair of corner rails of the cabinet, wherein the mounting bracket is collapsible to change an internal angle between the first leg and the second leg.

15. The computer hardware unit of claim 14, wherein the first leg of the mounting bracket is longer than the second leg.

16. The computer hardware unit of claim 14, wherein the mounting bracket is a 90 degree stop hinge wherein in a mounting position the first leg is perpendicular to the second leg and in an installation position, the first leg overlays the second leg.

17. A data center cabinet, comprising:
a plurality of slots;
a computer hardware unit according to claim 14 installed within one of the plurality of slots.

18. The data center cabinet of claim 17, further comprising at least one power outlet unit secured to the cabinet adjacent to the computer hardware unit,
wherein the at least one power outlet unit impedes removal of the computer hardware unit from the slot when the first leg is substantially perpendicular to the second leg, and
wherein the computer hardware unit is removable from the cabinet past the at least one power outlet unit when the first leg is collapsed relative to the second leg.

* * * * *

UNITED STATES PATENT AND TRADEMARK OFFICE
CERTIFICATE OF CORRECTION

PATENT NO.         : 10,058,005 B1
APPLICATION NO.    : 15/349567
DATED              : August 21, 2018
INVENTOR(S)        : Gary Willard It is certified that error appears in the above-identified patent and that said Letters Patent is hereby corrected as shown below:

In the Claims

In Column 6, Claim 1, Line 43, "pair of corner rails of the cabinet, L-shaped brackets of slide tracks of the pair of slide tracks; and" should read -- pair of corner rails of the cabinet, L-shaped brackets of the pair of L-shaped brackets being configured to slide within respective slide tracks of the pair of slide tracks; and --

In Column 6, Claim 1, Line 53, "leg and the second leg to avow the mounting bracket to fold" should read -- leg and the second leg to allow the mounting bracket to fold --

In Column 7, Claim 7, Line 24, "avow the housing to slide relative to the pair of L-shaped" should read -- allow the housing to slide relative to the pair of L-shaped --

In Column 8, Claim 14, Line 20, "respective slide tracks of the air of slide tracks;" should read -- respective slide tracks of the pair of slide tracks; --

Signed and Sealed this
Sixth Day of November, 2018

Andrei Iancu
*Director of the United States Patent and Trademark Office*